US012726739B2

(12) United States Patent
Lee et al.

(10) Patent No.: US 12,726,739 B2
(45) Date of Patent: Sep. 1, 2026

(54) IMAGE SENSOR INCLUDING FIELD-EFFECT TRANSISTORS

(71) Applicant: SAMSUNG ELECTRONICS CO., LTD., Suwon-si (KR)

(72) Inventors: Hyeokjong Lee, Suwon-si (KR); Yunjung Kim, Suwon-si (KR); Sungwook Jun, Suwon-si (KR); Yeongseok Choi, Suwon-si (KR); Minho Kwon, Suwon-si (KR); Mooyoung Kim, Suwon-si (KR); Yunhong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 18/399,145

(22) Filed: Dec. 28, 2023

(65) Prior Publication Data

US 2024/0292129 A1 Aug. 29, 2024

(30) Foreign Application Priority Data

Feb. 24, 2023 (KR) ........................ 10-2023-0025284

(51) Int. Cl.

*H04N 25/79* (2023.01)
*H04N 25/78* (2023.01)
*H10F 39/00* (2025.01)
*H04N 25/60* (2023.01)
*H10D 30/62* (2025.01)

(52) U.S. Cl.

CPC ............ *H04N 25/79* (2023.01); *H04N 25/78* (2023.01); *H10F 39/80373* (2025.01); *H04N 25/60* (2023.01); *H10D 30/62* (2025.01)

(58) Field of Classification Search

CPC ........ H04N 25/75; H04N 25/78; H04N 25/79; H10F 39/80373; H10F 39/80377; H10D 30/62

See application file for complete search history.

(56) References Cited

U.S. PATENT DOCUMENTS 9,652,575 B2 5/2017 Shen
2012/0236629 A1 9/2012 Juengling
2019/0103434 A1* 4/2019 Kobayashi ............ H10F 39/811

(Continued)

FOREIGN PATENT DOCUMENTS

JP 5-335954 A 12/1993
JP 6373441 B2 8/2018

(Continued)

OTHER PUBLICATIONS

Communication issued Jun. 17, 2026 by the Taiwan National Intellectual Property Administration in counterpart Taiwanese Patent Application No. 113105803.

*Primary Examiner* — Daniel M Pasiewicz
(74) *Attorney, Agent, or Firm* — Sughrue Mion, PLLC

(57) ABSTRACT

An image sensor includes a first chip including a pixel array including a plurality of pixels, and a second chip including a peripheral circuit configured to drive the pixel array and process a pixel signal output from the pixel array, where the first chip and the second chip are stacked, the peripheral circuit is implemented with a plurality of field effect transistors (FETs), and at least one channel structure of each of the plurality of FETs all extend in a same direction.

17 Claims, 16 Drawing Sheets

(56) References Cited

U.S. PATENT DOCUMENTS

| | | | | |
|---|---|---|---|---|
| 2019/0104270 | A1* | 4/2019 | Sakurai | H04N 25/766 |
| 2021/0043671 | A1* | 2/2021 | Yoneda | H01L 24/80 |
| 2022/0020792 | A1 | 1/2022 | Kimizuka | |
| 2022/0367536 | A1 | 11/2022 | Saka et al. | |
| 2022/0367540 | A1* | 11/2022 | Saka | H10F 39/80373 |
| 2022/0415942 | A1 | 12/2022 | Yoon et al. | |
| 2023/0139176 | A1* | 5/2023 | Yokoyama | H10F 39/811<br>348/308 |

FOREIGN PATENT DOCUMENTS

| | | | |
|---|---|---|---|
| KR | 10-2021-0104725 | A | 8/2021 |
| TW | 202213898 | A | 4/2022 |
| TW | 202240562 | A | 10/2022 |
| WO | 2010/004652 | A1 | 1/2010 |
| WO | 2016/117288 | A1 | 7/2016 |

* cited by examiner

IMAGE SENSOR INCLUDING FIELD-EFFECT TRANSISTORS

CROSS-REFERENCE TO RELATED APPLICATION

This application is based on and claims priority to Korean Patent Application No. 10-2023-0025284, filed on Feb. 24, 2023, in the Korean Intellectual Property Office, the disclosure of which is incorporated herein by reference in its entirety.

BACKGROUND

One or more embodiments of the disclosure relate to an image sensor, and more particularly, to an image sensor including fin field-effect transistors (FinFETs).

An image sensor may refer to a device that captures a two-dimensional or three-dimensional image of an object. The image sensor generates an image of an object using a photoelectric conversion element that reacts according to the intensity of light reflected from the object. With the recent development of complementary metal-oxide semiconductor (CMOS) technology, CMOS image sensors using CMOSs are widely used. Furthermore, a transistor included in an image sensor may be implemented as a planar FET or a FinFET, dependent on parameters and/or preferences.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public

SUMMARY

One or more example embodiments provide an image sensor including a fin field-effect transistor (FinFET).

Additional aspects will be set forth in part in the description which follows and, in part, will be apparent from the description, or may be learned by practice of the presented embodiments.

According to an aspect of an example embodiment, an image sensor may include a first chip including a pixel array including a plurality of pixels, and a second chip including a peripheral circuit configured to drive the pixel array and process a pixel signal output from the pixel array, where the first chip and the second chip are stacked, the peripheral circuit is implemented with a plurality of field effect transistors (FETs), and at least one channel structure of each of the plurality of FETs all extend in a same direction.

According to an aspect of an example embodiment, an image sensor may include a first chip including a pixel array including a plurality of pixels, and a second chip including a peripheral circuit configured to drive the pixel array and process a pixel signal output from the pixel array, where the first chip and the second chip are stacked, the peripheral circuit comprises an analog circuit region in which an analog circuit is provided and a digital circuit region in which a digital circuit is provide, the digital circuit region comprises a plurality of FETs, and the analog circuit region comprises a planar FET.

According to an aspect of an example embodiment, an image sensor may include a first chip including a pixel array including a plurality of pixels and a second chip under the first chip and including a first peripheral circuit, where the first peripheral circuit includes a plurality of FinFETs, and a plurality of fins of the FinFETs that are on the second chip all extend in the same direction.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
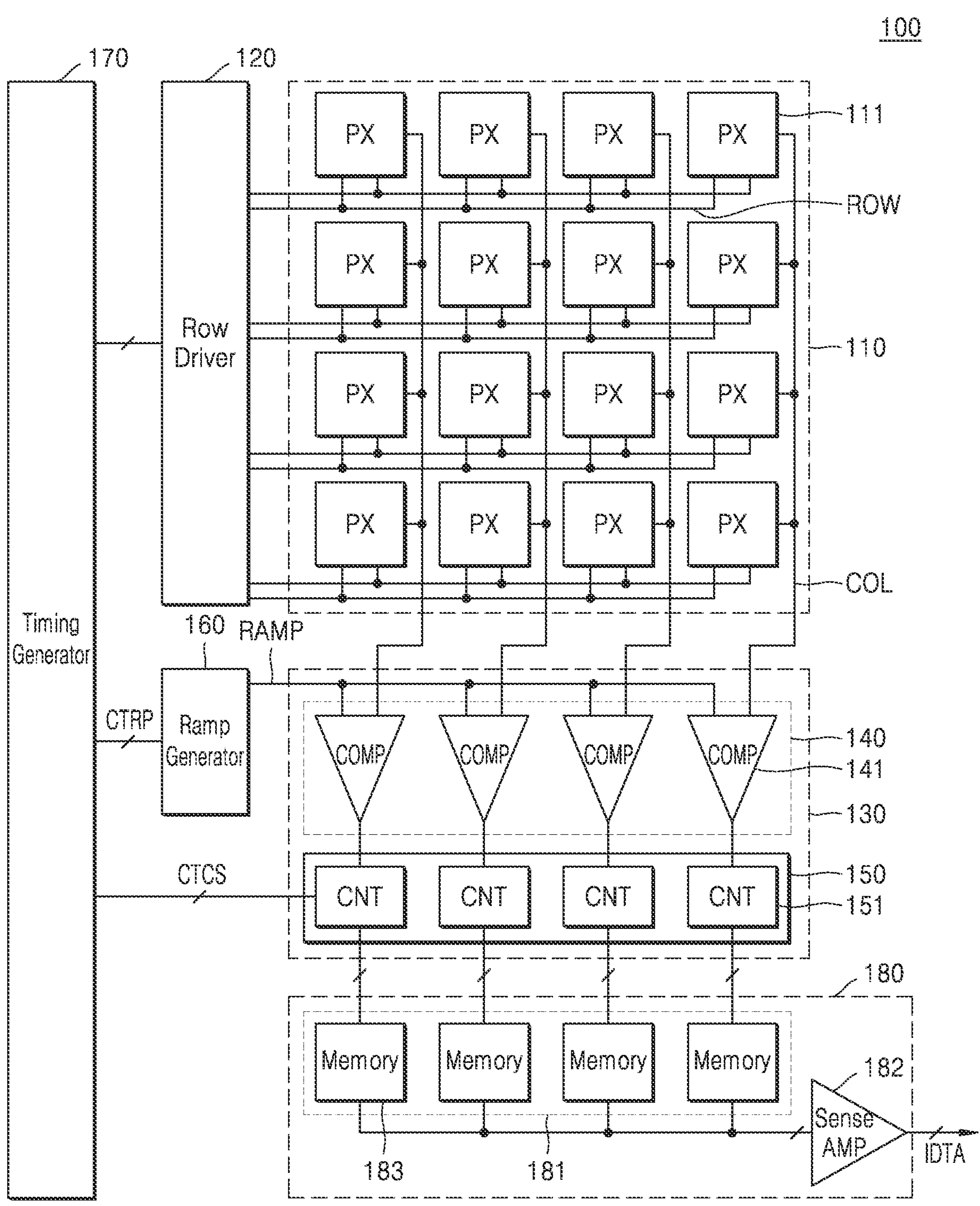
FIG. 1 is a block diagram illustrating an image sensor according to an embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram illustrating an image sensor 100 according to an embodiment.

The image sensor 100 may be mounted on an electronic device having an image or light sensing function. For example, the image sensor 100 may be mounted on electronic devices, such as cameras, smartphones, wearable devices, Internet of Things (IoT) devices, tablet personal computers (PCs), personal digital assistants (PDAs), portable multimedia players (PMPs), navigation devices, and the like. In addition, the image sensor 100 may be mounted on an electronic device provided as a component for vehicles, furniture, manufacturing facilities, doors, various measuring devices, and the like.

Referring to FIG. 1, an image sensor 100 may include a pixel array 110, a row driver 120, an analog-to-digital converter (ADC) 130, a ramp generator 160, a timing generator 170, and a buffer 180.

The pixel array 110 may include a plurality of pixels 111 (e.g., pixels PX) arranged in a matrix form, each connected to row lines (e.g., ROW) and column lines (e.g., COL). Each of the plurality of pixels 111 may include a light sensing element. For example, the light sensing element may include a photo diode, a photo transistor, a photo gate, or a pinned photodiode. Each of the plurality of pixels 111 may include at least one light sensing element, and in an embodiment, each of the plurality of pixels 111 may include a plurality of light sensing elements.

The plurality of pixels 111 may sense light using a light sensing element and convert the light into a pixel signal that is an electrical signal. The pixel signal may include reset signals generated according to a reset operation of each of the plurality of pixels 111, and may include image signals according to the light sensing operation of each of the plurality of pixels 111.

Each of the plurality of pixels 111 may sense light in a predetermined spectral region. For example, the plurality of pixels 111 may include a red pixel for converting light in the red spectral region into electrical signals, a green pixel for converting light in the green spectral region into an electrical signal, and a blue pixel for converting light in the blue spectrum region into an electrical signal. A color filter for transmitting light in a predetermined spectral region may be disposed above each of the plurality of pixels 111.

The timing generator 170 may output a control signal or a clock signal to the row driver 120, the ADC 130, and the ramp generator 160, respectively, such that the operation or timing of the row driver 120, the ADC 130, and the ramp generator 160 may be controlled.

The row driver 120 may drive the pixel array 110 in units of rows. The row driver 120 may decode the row control signal (e.g., address signal) generated by the timing generator 170, and select at least one row line among row lines constituting the pixel array 110 in response to the decoded row control signal. For example, the row driver 120 may generate a row select signal. The pixel array 110 may output a pixel signal from a row selected by a row select signal provided from the row driver 120.

The ADC 130 may convert a pixel signal that is an analog signal input from the pixel array 110 into a digital signal. The ADC 130 may include a plurality of column parallel ADCs that receive pixel signals from the pixel array 110 through column lines (e.g., column line COL). The ADC 130 may include a comparison block 140 and a counter block 150.

Each of the plurality of column parallel ADCs may include a comparison circuit 141 and a counter 151. In FIG. 1, each of the plurality of column parallel ADCs is illustrated as receiving one ramp signal RAMP, but the disclosure is not limited thereto. Each of the plurality of column parallel ADCs may receive a corresponding ramp signal among ramp signals having different voltage levels.

Also, in FIG. 1, each of a plurality of column parallel ADCs is illustrated as being connected to a corresponding one column line (e.g., column line COL), but the disclosure is not limited thereto. One column parallel ADC may be connected to a plurality of column lines, and the column lines connected to each of the plurality of column parallel ADCs may be changed by a multiplexer.

The comparison block 140 may compare a pixel signal output from a pixel connected to any one of the column lines (e.g., column line COL) with the ramp signal RAMP. The comparison block 140 may include a plurality of comparison circuits 141, and each of the plurality of comparison circuits 141 may be connected to at least one corresponding column line. Each of the plurality of comparison circuits 141 may receive a ramp signal RAMP from the ramp generator 160.

The comparison circuit 141 may receive a pixel signal from at least one corresponding column line (e.g., column line COL), receive the ramp signal RAMP from the ramp generator 160, compare the pixel signal to the ramp signal RAMP, and output a comparison result signal. The comparison circuit 141 may generate a comparison result signal to which a correlated double sampling technique is applied, and may be referred to as a correlated double sampling circuit. Pixel signals output from the plurality of pixels 111 may have a deviation due to a pixel-specific characteristic of each pixel 111 and/or a deviation due to a difference in characteristics of logic for outputting a pixel signal from the pixel 111. To compensate for the deviation between these pixel signals, calculating a reset component (or reset signal) and an image component (or image signal) for each of the pixel signals and extracting the difference as an effective signal component, and this process may be referred to as correlated double sampling. The comparison circuit 141 may output a comparison result signal to which a correlated double sampling technique is applied.

The ramp generator 160 may generate a ramp signal RAMP. The ramp generator 160 may generate the ramp signal RAMP in response to the ramp control signal CTRP provided from the timing generator 170. The ramp control signal CTRP may include a ramp enable signal and a mode signal. When the ramp enable signal is activated, the ramp generator 160 may generate a ramp signal having a slope set based on the mode signal. For example, the ramp generator 160 may generate a ramp signal RAMP that decreases with a constant slope.

The ramp generator 160 may cause the voltage level of the ramp signal RAMP to change while the flowing current changes over time using a current type digital-to-analog converter (DAC) or a voltage-to-current converter (V-I converter). The ramp signal RAMP generated by the ramp generator 160 may be provided to the comparison circuit 141 through a buffer (e.g., a DAC buffer) of the ramp generator 160. The ramp signal RAMP may be generated as a voltage having a single slope.

The counter block 150 may include a plurality of counters 151. Each of the plurality of counters 151 may be connected to an output node of the comparison circuits 141 to count based on an output signal of each comparison circuit 141. The counter control signal CTCS may include a counter clock signal, a counter reset signal for controlling reset operations of the plurality of counters 151, and an inversion signal for inverting internal bits of each of the plurality of counters 151. The counter block 150 counts the comparison result signal according to the counter clock signal and outputs the counted result as a digital signal.

The counter 151 may include an up/down counter and a bit-wise inversion counter. The bit-wise counter may perform an operation similar to that of the up/down counter. For example, a bit-wise counter may perform a function of only an up count and a function of inverting all bits inside the counter to produce the 1's complement when a signal is received. After performing a reset count, the bit-wise counter may convert a result of the reset count into a 1's complement (i.e., a negative value) by inverting the result of the reset count.

However, the image sensor 100 according to the disclosure is not limited thereto. The image sensor 100 may further include a counting code generator that performs counting codes under the control of the timing generator 170. The counting code generator may be implemented as a gray code generator and may generate a plurality of code values having a resolution according to a set number of bits as counting codes. For example, the plurality of counters 151 may include a latch circuit and an arithmetic circuit. The latch circuit may receive the counting code from the counting code generator, the output signal from the comparison block 140, and latch the code value of the counting code at a time point at which the level of the comparison signal transitions. The arithmetic circuit may generate an image signal value from which the reset level of the pixel 111 is removed by calculating the reset value and the image signal value. The counter block 150 may output the image signal value from which the reset level is removed as a pixel value.

The buffer 180 may temporarily store the digital signal output from the ADC 130, sense the digital signal, amplify the digital signal, and output the digital signal. The buffer 180 may include a column memory block 181 and a sense amplifier (Sense AMP) 182. The column memory block 181 may include a plurality of memories 183. Each of the plurality of memories 183 may temporarily store the digital signals output from each of the plurality of counters 151 and output the stored digital signals to the sense amplifier 182. The sense amplifier 182 may sense and amplify digital signals output from the plurality of memories 183. The sense amplifier 182 may output the amplified digital signals as image data IDTA.

The image sensor 100 may further include a signal processing unit (e.g., an image signal processor) that performs signal processing on image data IDTA, and an interface circuit outputting the image data IDTA to the outside. In addition, the image sensor 100 may further include a high voltage generator for generating a high internal voltage used inside the image sensor 100 and a reference voltage generator for generating a reference voltage. For example, the signal processing unit may perform noise reduction processing, gain adjustment, waveform shaping processing, interpolation processing, white balance processing, gamma processing, edge enhancement processing, and the like.

Figure 2:
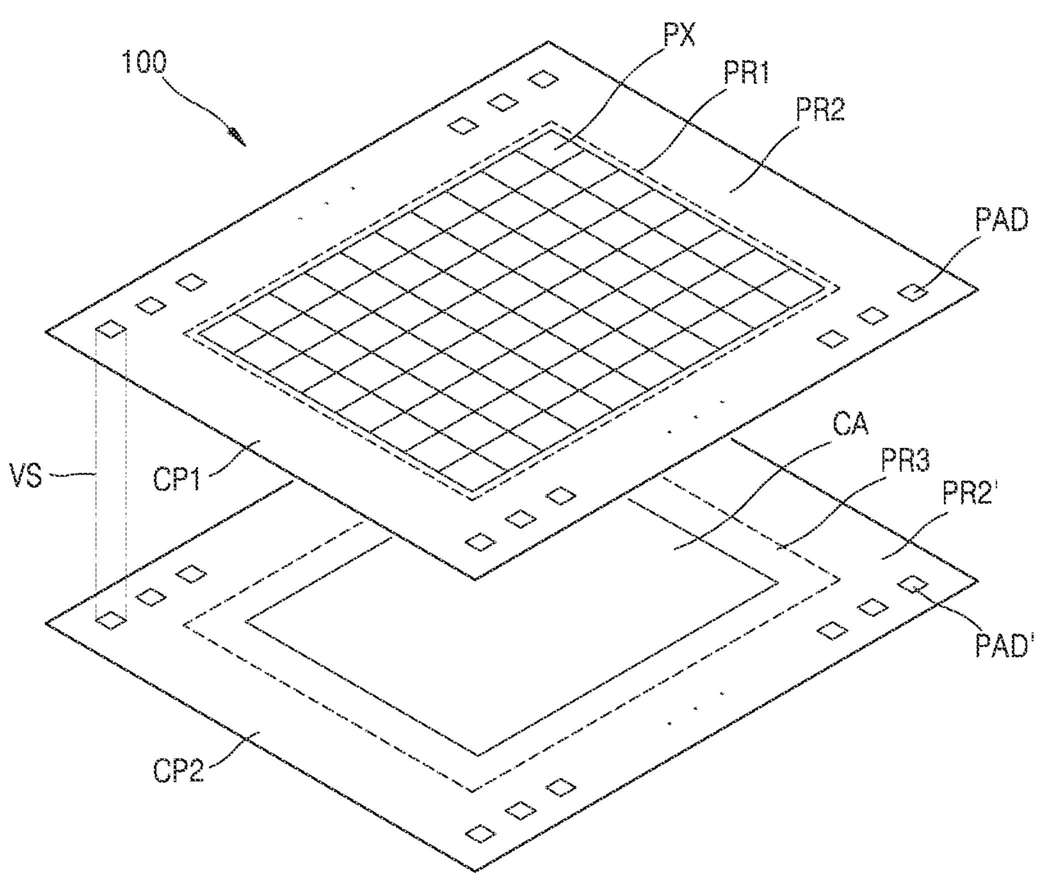
FIG. 2 is a diagram illustrating an image sensor according to an embodiment.

FIG. 2 is a diagram illustrating an image sensor 100 according to an embodiment.

Referring to FIG. 2, an image sensor 100 may be a stacked image sensor including a first chip CP1 and a second chip CP2 stacked in a vertical direction. The image sensor 100 may be an implementation of the image sensor 100 described with reference to FIG. 1.

The first chip CP1 may include a pixel region PR1 and a pad region PR2, and the second chip CP2 may include a peripheral circuit region PR3 and a pad region PR2'. A pixel array in which a plurality of pixels PX are disposed may be formed in the pixel region PR1. Each of the plurality of pixels PX may correspond to a pixel 111 described with reference to FIG. 1.

The peripheral circuit region PR3 of the second chip CP2 may include a peripheral circuit CA for driving the pixel PX or processing a pixel signal output from the pixel PX, and may include a plurality of transistors. For example, the peripheral circuit CA may include the row driver 120, the ADC 130, the ramp generator 160, the timing generator 170, and the buffer 180 described with reference to FIG. 1. Also, the peripheral circuit CA may further include a signal processor and an interface circuit. The peripheral circuit region PR3 may provide a constant signal to each of the plurality of pixels PX included in the pixel region PR1 and may read a pixel signal output from each of the plurality of pixels PX.

The pad region PR2' of the second chip CP2 may include a lower conductive pad PAD'. The pad region PR2' may include a plurality of lower conductive pads PAD', and each may correspond to an upper conductive pad PAD. The lower conductive pad PAD' may be electrically connected to the upper conductive pad PAD of the first chip CP1 through the via structure VS.

Figure 3:
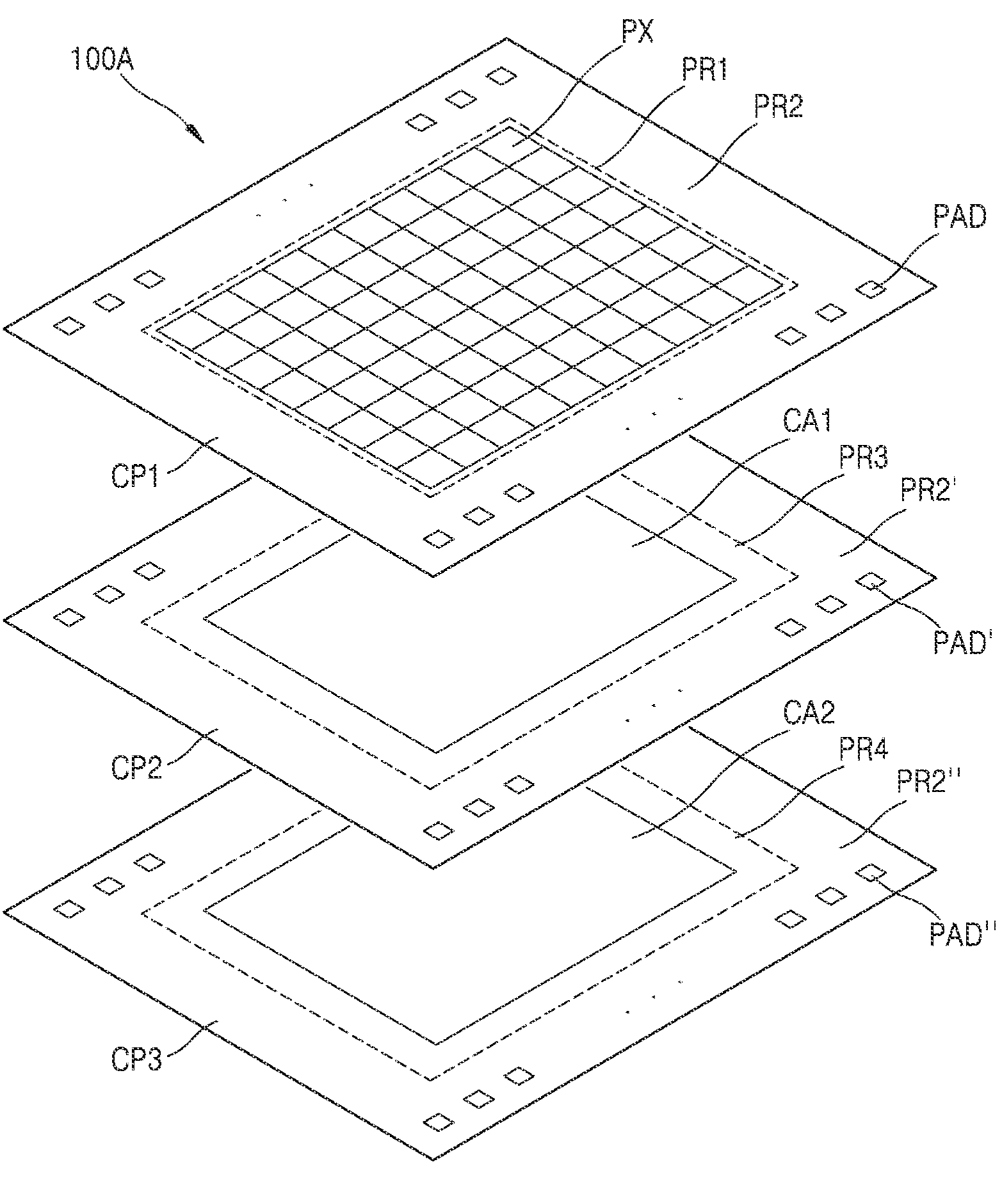
FIG. 3 is a diagram illustrating an image sensor according to an embodiment.

FIG. 3 is a diagram illustrating an image sensor 100A according to an embodiment. Referring to FIG. 3, the image sensor 100A may be a stacked image sensor including a first chip CP1, a second chip CP2, and a third chip CP3 stacked in a vertical direction. The image sensor 1000 may be an implementation of the image sensor 100 described with reference to FIG. 1.

The first chip CP1 may include a pixel region PR1 and a pad region PR2. A pixel array in which a plurality of pixels PX are disposed may be formed in the pixel region PR1.

The second chip CP2 may include a peripheral circuit region PR3 and a pad region PR2'. The peripheral circuit region PR3 of the second chip CP2 may include a first peripheral circuit CA1 for driving the pixel PX or processing a pixel signal output from the pixel 111, and may include a plurality of transistors. For example, the first peripheral circuit CA1 may include the row driver 120, the ADC 130, the ramp generator 160, the timing generator 170, and the buffer 180 described with reference to FIG. 1.

The third chip CP3 may include a peripheral circuit region PR4 and a pad region PR2". The peripheral circuit region PR4 may include a second peripheral circuit CA2 for processing a pixel signal output from the pixel PX and may include a plurality of transistors. For example, the second peripheral circuit CA2 may include at least some components of the signal processing unit and an interface circuit, and specifically, include a PHY interface and a circuit configuration for performing artificial intelligence (AI) calculations for signal processing.

A pad region PR2" of the third chip CP3 may include a conductive pad PAD". The pad region PR2" of the third chip CP3 may include a plurality of conductive pads PAD", which may be electrically connected to the upper conductive pad PAD or the lower conductive pad PAD' through a via structure.

Figure 4:
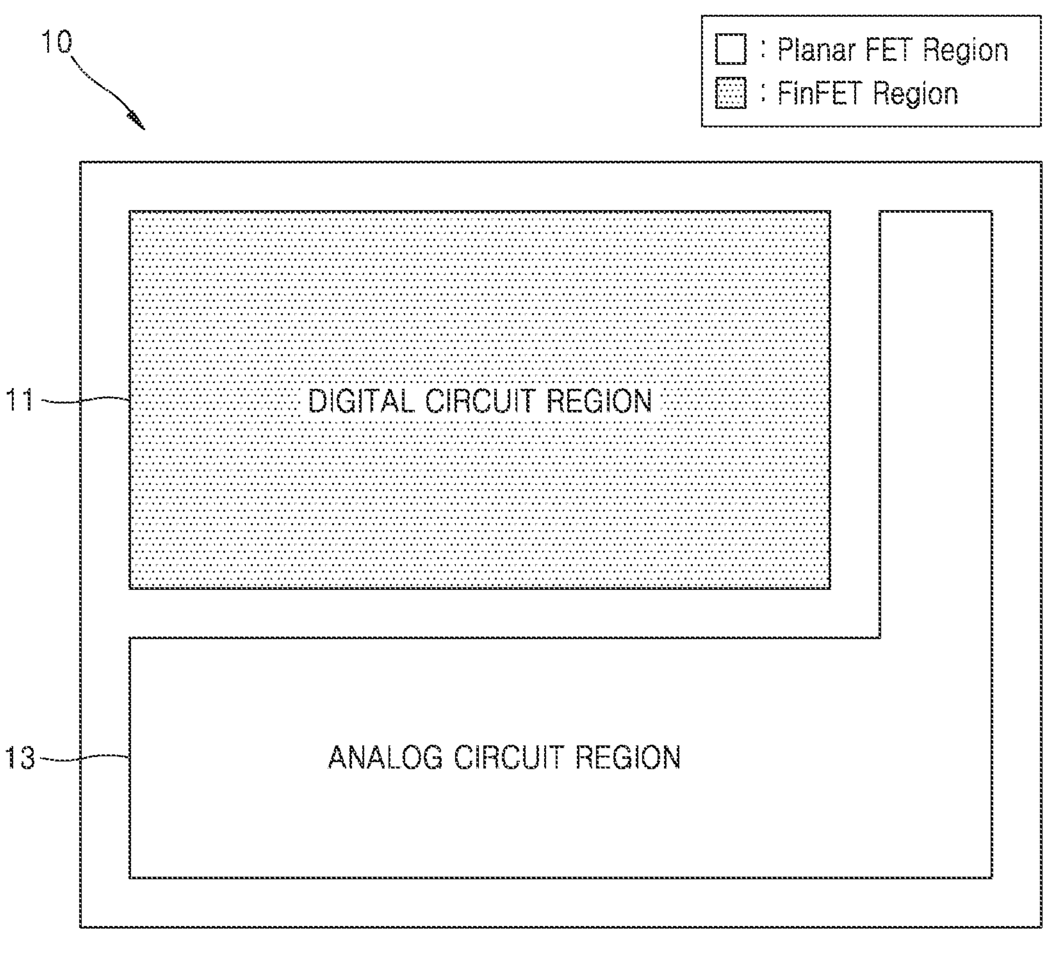
FIGS. 4, 5 and 6 are layout diagrams illustrating arrangements of transistors of peripheral circuit chips in which peripheral circuits of an image sensor are disposed, according to an embodiment.
Figure 4:
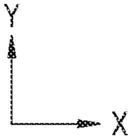
Figure 7A:
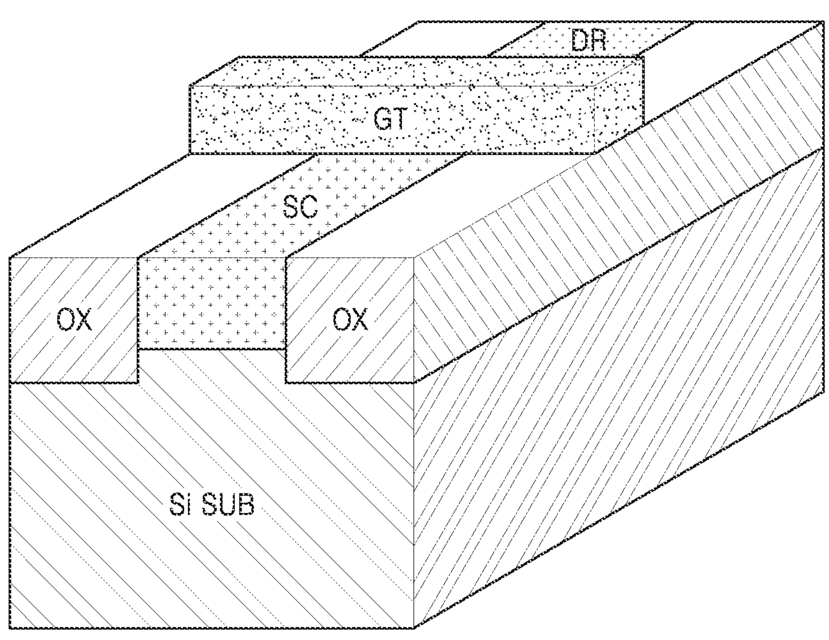
FIG. 7A is a diagram illustrating a structure of a planar field-effect transistors (FET) according to an embodiment.
Figure 7B:
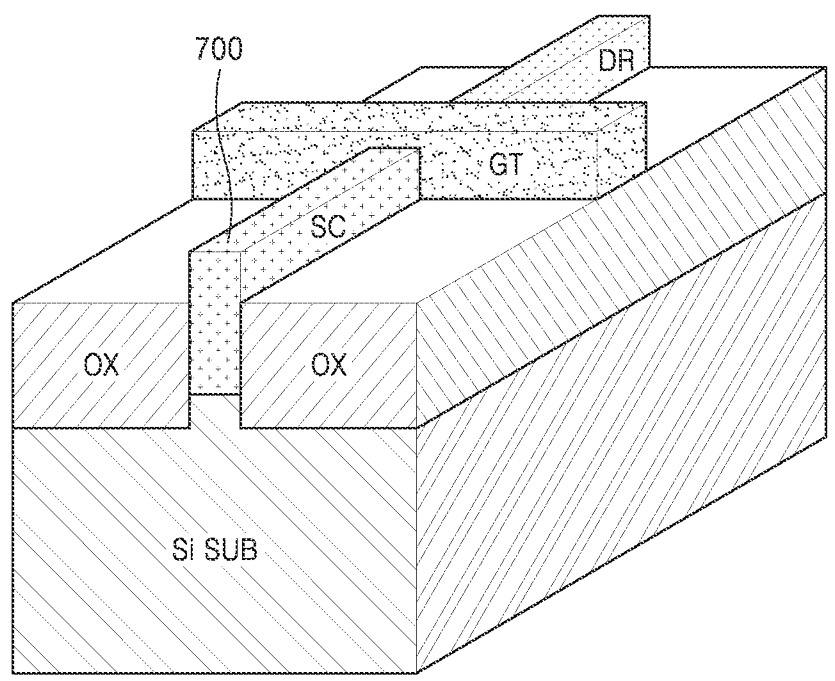
FIG. 7B is a diagram illustrating the structure of a fin field-effect transistor (FinFET) according to an embodiment.

FIG. 4 is a layout diagram illustrating transistor arrangements of a peripheral circuit chip 10 in which a peripheral circuit of an image sensor is disposed according to an embodiment. FIG. 7A is a diagram illustrating a structure of a planar field-effect transistor (FET) according to an embodiment. FIG. 7B is a diagram illustrating a structure of a fin field-effect transistor (FinFET) according to an embodiment.

Figure 5:
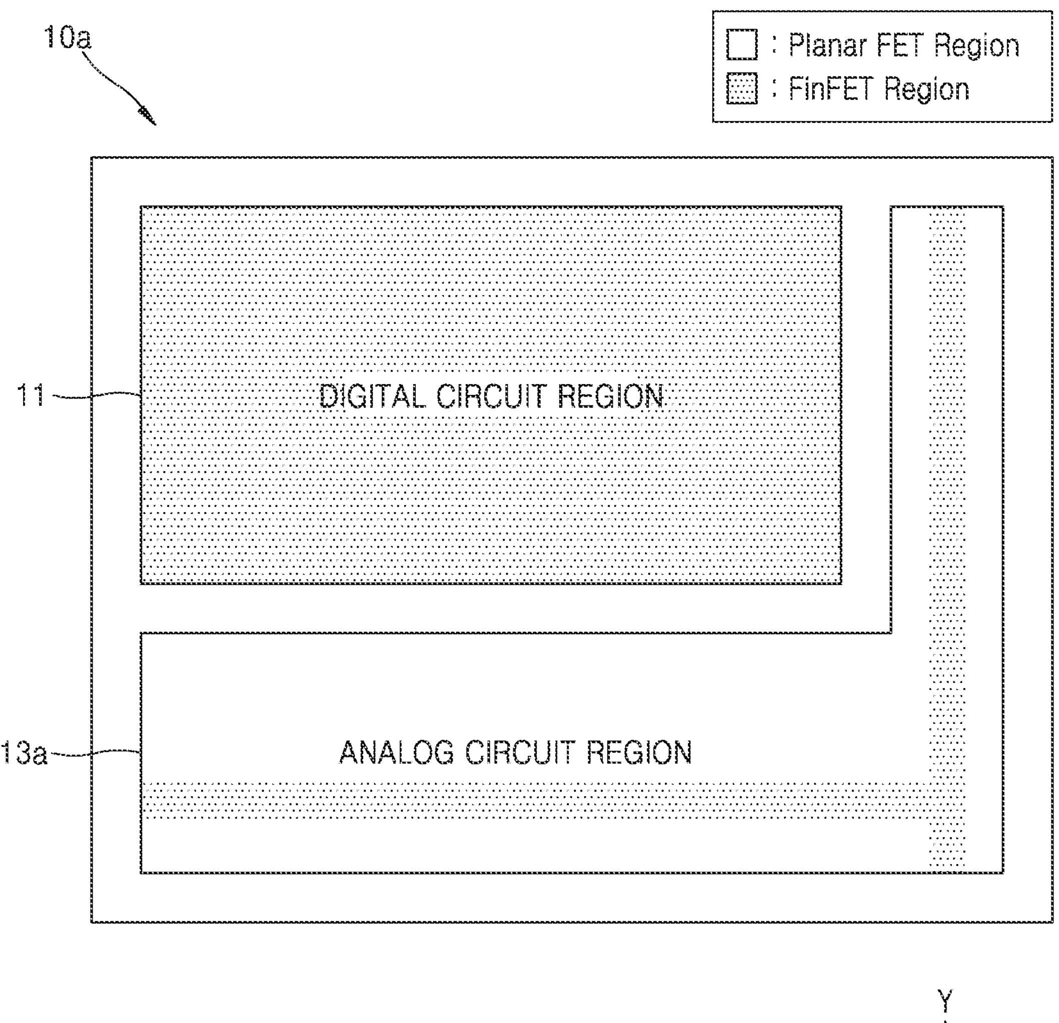
Figure 5:
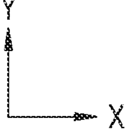
Figure 6:
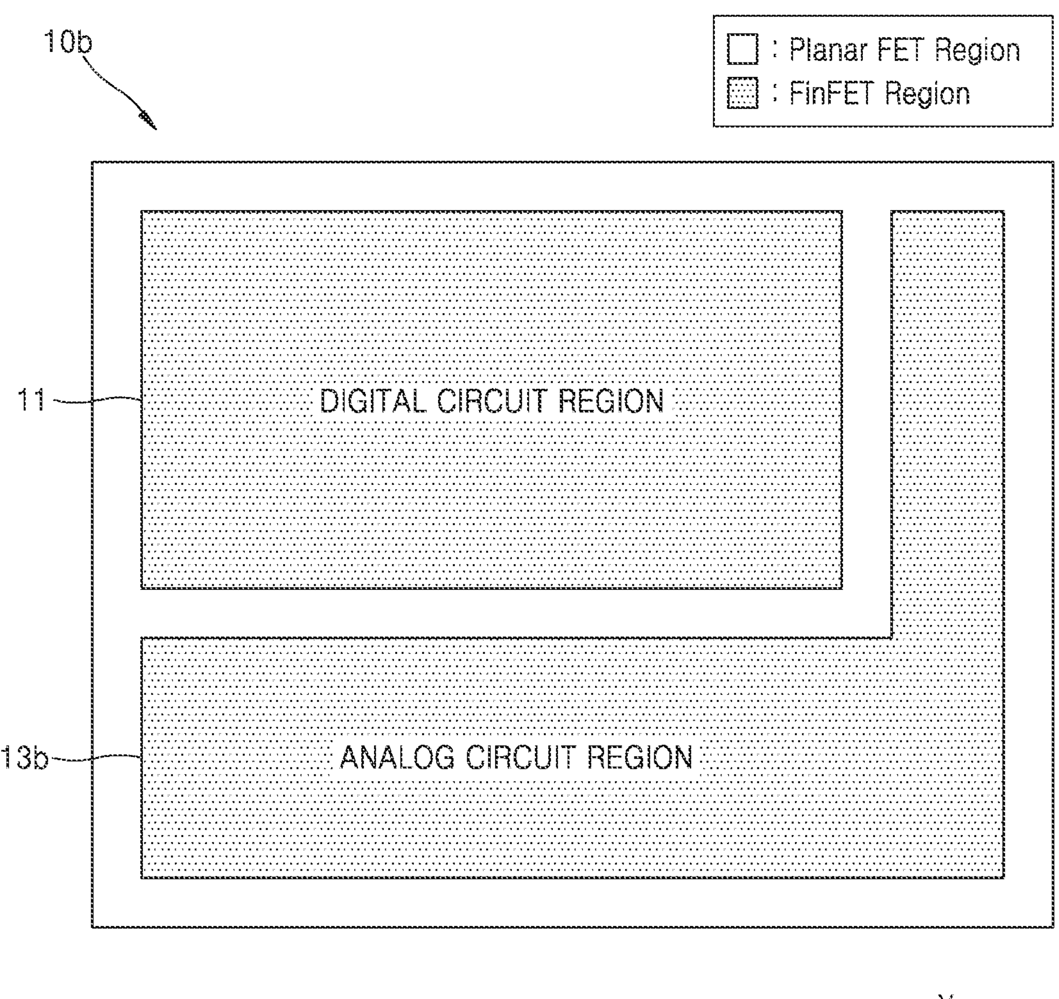
Figure 6:
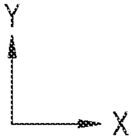

In FIGS. 4 to 6, each of the peripheral circuit chips 10, 10$a$, and 10$b$ on which peripheral circuits other than the pixel array 110 of the image sensor 100 are disposed may be the second chip CP2 of FIGS. 2 and 3 or the third chip CP3 of FIG. 3.

Referring to FIG. 4, the peripheral circuit chip 10 on which peripheral circuits are formed may include a digital circuit region 11 where digital circuits are disposed and an analog circuit region 13 where analog circuits are disposed. The digital circuitry may include, for example, the timing generator 170 of FIG. 1 and a signal processing unit. The analog circuitry may include, for example, a row driver 120, an ADC 130, and a ramp generator 160. Also, the analog circuit may further include a high voltage generator for generating a high internal voltage used in the image sensor, and a reference voltage generator for generating a reference voltage used for operation of the image sensor.

Referring to FIGS. 4 and 7A, the analog circuit of the analog circuit region 13 of the peripheral circuit chip 10 may be implemented with a plurality of planar FETs. That is, the analog circuit region 13 may be a planar FET region and may include a plurality of planar FETs.

The planar FET may include a substrate Si SUB, an oxide region OX, a source region SC, a gate region GT, and a drain region DR. The substrate Si SUB may include silicon (Si), for example, single crystal silicon, polycrystalline silicon, or amorphous silicon. The material of the substrate 101 may not limited to silicon. In embodiments, the substrate Si SUB may include a group IV semiconductor, such as germanium (Ge), a group IV-IV compound semiconductor, such as silicon germanium (SiGe) or silicon carbide (SiC), or a III-V group compound semiconductor, such as gallium arsenide (GaAs), indium arsenide (InAs), or indium phosphide (InP).

In the planar FET, the gate region GT, the source region SC, and the drain region DR may contact each other by a single plane. The source region SC and the drain region DR may be heavily doped regions.

Since the planar FET contacts the source region SC and the drain region DR through one plane, the area controllable by the gate region GT has a smaller characteristic than that of the FinFET described later. In the planar FET, the gate region GT, the source region SC, and the drain region DR contact each other by one plane, such that the generation of thermal noise may be less than FinFET, and the planar FET may be stably driven even at high voltage.

Referring to FIGS. 4 and 7B, the digital circuit of the digital circuit region 11 of the peripheral circuit chip 10 may be implemented as a plurality of FinFETs. That is, the digital circuit region 11 may be a FinFET region and may include a plurality of FinFETs. In an embodiment, all fins, such as at least one fin 700, formed in the digital circuit region 11 may extend in the same direction.

The FinFET may include a substrate Si SUB, an oxide region OX, a source region SC, a gate region GT, and a drain region DR. At least one fin extending in a direction (a direction parallel to the main surface of the substrate Si SUB) may be formed on the substrate Si SUB of the FinFET. However, unlike shown in FIG. 7B, a nanosheet may be formed on the fin, and for example, a multi bridge channel (MBC) FET may be formed surrounding or at least partially surrounding the nanosheet in the gate region GT. Alternatively, on the fin, a gate-all-around (GAA) FET in which a nanowire is surrounded or at least partially surrounded by a gate region GT may be formed, and a vertical GAA FET in which a plurality of stacked nanowires are surrounded or at least partially surrounded by a gate region GT may be formed.

In the FinFET, a gate region GT, a source region SC, and a drain region DR may contact each other by three planes. The source region SC and the drain region DR may be heavily doped regions. The source region SC and the drain region DR may be formed by highly doping fins between different gate regions GT, or may be formed through epi growth after upper portions of the fins are removed.

Since the source region SC and the drain region DR are contacted through three planes, the area controllable by the gate region GT may be larger than that of the planar FET. Therefore, the overall size of the FinFET may be smaller than that of the planar FET, such that high-speed operation is possible, and operation of the FinFET is possible with a small current. In addition, FinFET may have a higher gm value than planar FET, may have a stable threshold voltage when turned on, and may realize high capacitance. Accordingly, considering the operating characteristics of each of the circuits constituting the peripheral circuit, the image sensor according to the disclosure configures each of the circuits with FinFET or planar FET, such that an image sensor having optimized operating characteristics and size may be provided.

FIG. 5 is a layout diagram illustrating transistor arrangements of a peripheral circuit chip 10*a* in which a peripheral circuit of an image sensor is disposed according to an embodiment. Referring to FIG. 5, compared to the peripheral circuit chip 10 of FIG. 4, FinFETs other than planar FETs may be formed in some regions of analog circuit region 13*a* of the peripheral circuit chip 10*a*. In an embodiment, fins formed on the peripheral circuit chip 10*a* may all extend in the same direction.

For example, a logic circuit for performing logic control within an analog circuit may be formed with a FinFET to reduce area and current in the same way as a digital circuit. For example, in the row driver 120 of FIG. 1, a row controller that performs a logic operation on a row control signal, which is a digital input, may be formed of a FinFET, and a DAC buffer of the ramp generator 160 providing the ramp signal RAMP generated by the ramp generator 160 to the comparison circuit 141 may be formed of a FinFET. In addition, a source follower included in the analog circuit may be formed of a FinFET to remove the body effect.

FIG. 5 is a layout diagram illustrating transistor arrangements of a peripheral circuit chip 10B in which a peripheral circuit of an image sensor is disposed according to an embodiment. Referring to FIG. 6, compared to the peripheral circuit chip 10 of FIG. 4, FinFETs may be formed in both the digital circuit region 11 and the analog circuit region 13*b* of the peripheral circuit chip 10*b*. That is, all peripheral circuits formed on the peripheral circuit chip 10*b* may be implemented as FinFETs. In an embodiment, fins formed on the peripheral circuit chip 10*b* may all extend in the same direction.

The extension directions of fins in the FinFET regions formed in the peripheral circuit chips 10, 10*a*, and 10*b* described with reference to FIGS. 4 to 6 may coincide with one direction. Accordingly, the FinFET process may be facilitated, and manufacturing of the peripheral circuit chips 10, 10*a*, and 10*b* may be facilitated.

Figure 8:
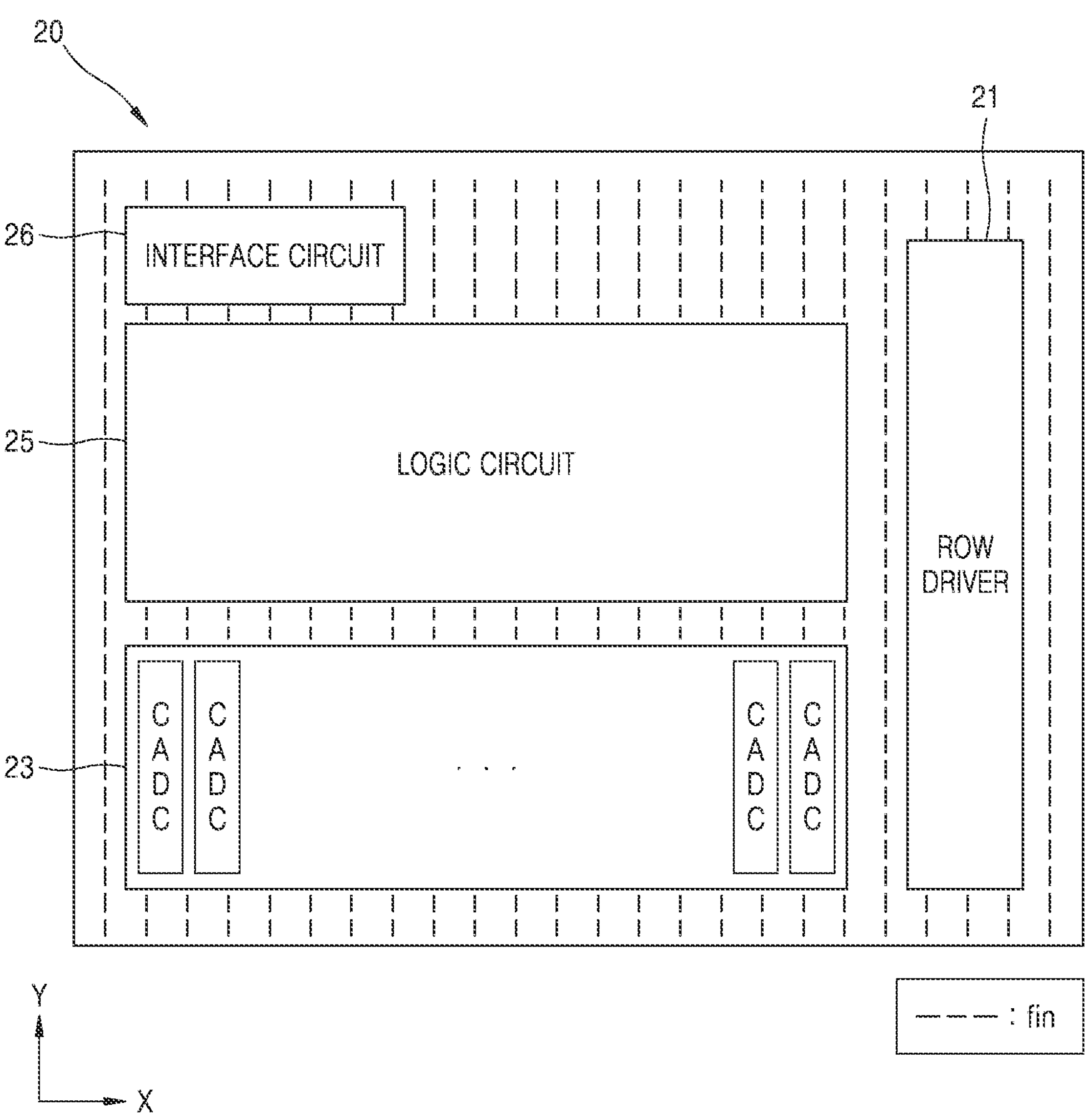
FIG. 8 is a layout diagram illustrating a layout of transistors of a peripheral circuit chip of an image sensor according to an embodiment.

FIG. 8 is a layout diagram illustrating a layout of transistors of a peripheral circuit chip 20 on which a peripheral circuit of an image sensor is disposed according to an embodiment. The peripheral circuit chip 20 of FIG. 8 may correspond to the second chip CP2 of FIGS. 2 and 3 or the third chip CP3 of FIG. 3.

Referring to FIG. 8, the peripheral circuit chip 20 may include a row driver 21, an ADC 23, a logic circuit 25, and an interface circuit 26. The row driver 21 may be the row driver 120 of FIG. 1, the ADC 23 may be the ADC 130 of FIG. 1, and the logic circuit 25 may include the timing generator 170 of FIG. 1 as well as a signal processing unit. The peripheral circuit chip 20 may include a plurality of FinFETs, and the extending direction of each fin of the FinFETs of the peripheral circuit chip 20 may be the same in the Y-axis direction (e.g., first horizontal direction). In FIG. 8, each fin and its corresponding direction is represented by the dashes in each dashed line.

The ADC 23 may include a plurality of column parallel ADCs CADCs, and each of the plurality of column parallel ADCs CADCs may include the comparison circuit 141 and the counter 151 of FIG. 1. Each of the plurality of column parallel ADCs CADCs may be arranged side by side in an X-axis direction (e.g., a second horizontal direction). At least one of the circuits constituting the plurality of column parallel ADCs CADCs (e.g., the comparison circuit 141 and the counter 151) may be implemented as a FinFET. When at least one of the comparison circuit 141 and the counter 151 is implemented as a FinFET, the logic circuit 25, such as the timing controller or the signal processing unit, may be implemented with FinFETs, and fin directions may all match each other.

Figure 9:
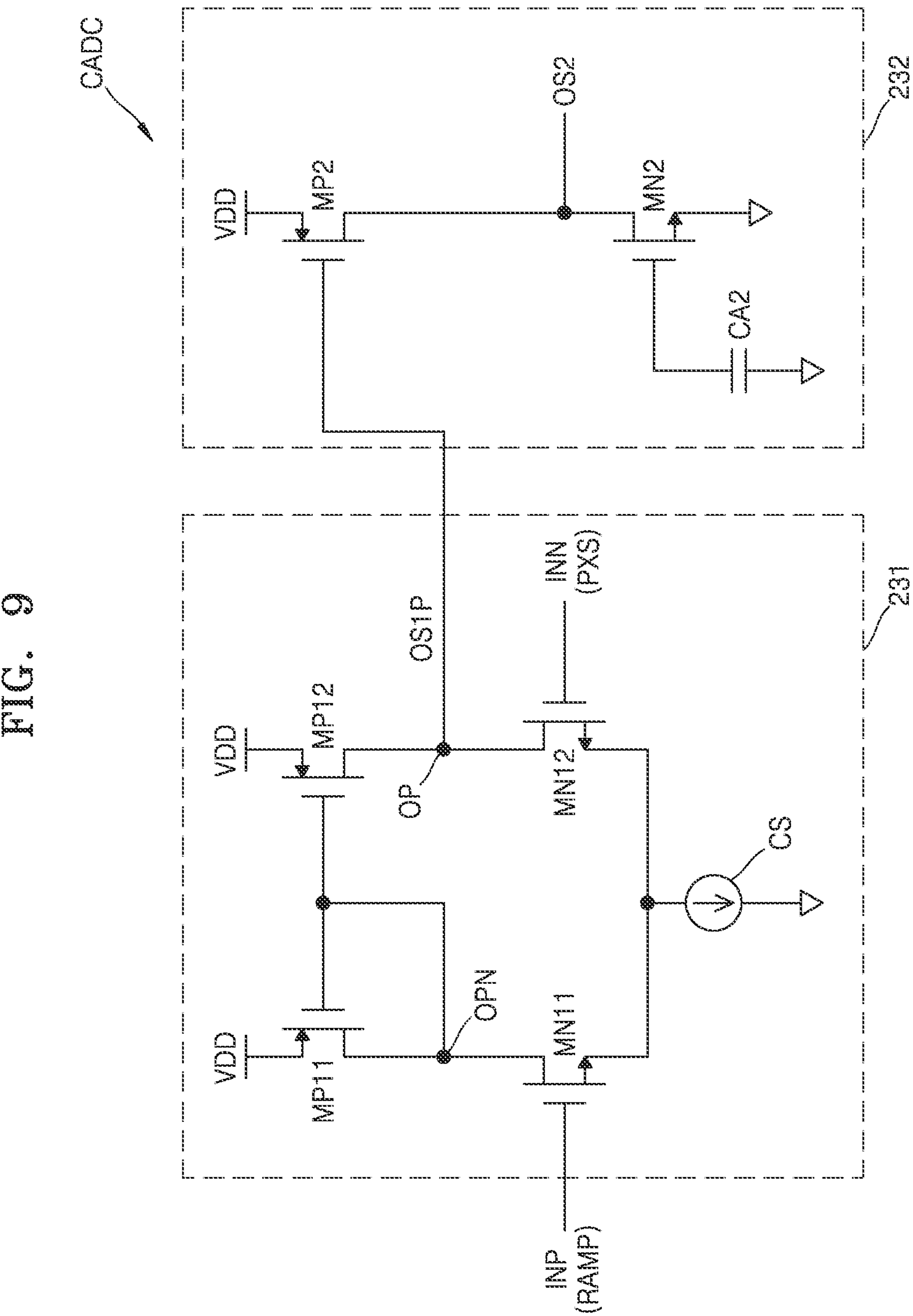
FIG. 9 is a circuit diagram of a column parallel analog-to-digital converter (ADC) according to an embodiment.

FIG. 9 is a circuit diagram of a column parallel ADC CADC according to an embodiment.

Referring to FIG. 9, a column parallel ADC CADC may include a first comparator 231 and a second comparator 232 constituting a comparison circuit (e.g., 141 of FIG. 1). The column parallel ADC CADC may include a counter (e.g., 151 of FIG. 1). Each of the first comparator 231 and the second comparator 232 may include an auto zero switch for an auto zero operation.

The first comparator 231 may include a differential amplifier and, as a differential amplifier, may be implemented as an operational transconductance amplifier (OTA), an operational amplifier, or the like.

The first input node of the first comparator 231 may receive the ramp signal RAMP as the first input signal INP, and the second input node of the first comparator 231 may receive the pixel signal PXS as the second input signal INN. The first comparator 231 may compare the pixel signal PXS and the ramp signal RAMP received through each of the capacitors and output the comparison result as the output signal OSIP through the first output node OP.

The first comparator 210 may include a plurality of transistors MP11, MP12, MN11, and MN12 and a current source CS. The first comparator 210 may include a first P-type transistor MP11, a second P-type transistor MP12, a first N-type transistor MN11, and a second N-type transistor MN12. For example, the current source CS may be implemented with an N-type transistor, that is, an N-type metal oxide semiconductor FET (MOSFET) (NMOSFET), and may have one end connected to ground voltage and may generate a bias current.

The gate of the first N-type transistor MN11 and the gate of the second N-type transistor MN12 may receive differential inputs (e.g., the first input signal INP and the second input signal INN, respectively), and the first N-type transistor MN11 and the second N-type transistor MN12 may generate a differential current according to a level difference between the first input signal INP and the second input signal INN. For example, the ramp signal RAMP may be received as the first input signal INP, and the pixel signal PXS may be received as the second input signal INN.

One end (i.e., the source) of the first N-type transistor MN11 may be connected to the current source CS, and one end (i.e., the drain) of the first N-type transistor MN11 may be connected to the second output node OPN. One end (i.e., the source) of the second N-type transistor MN12 may be connected to the current source CS, and one end (i.e., the drain) of the second N-type transistor MN12 may be connected to the second output node OP. The first N-type transistor MN11 and the second N-type transistor MN12 may be referred to as input transistors.

When the first input signal INP and the second input signal INN are the same, the same current may flow through the first N-type transistor MN11 and the second N-type transistor MN12, and when the first input signal INP and the second input signal INN are different, different currents may flow through the first N-type transistor MN11 and the second N-type transistor MN12. The sum of currents flowing through the first N-type transistor MN11 and the second N-type transistor MN12 may be equal to the bias current of the current source CS.

The power supply voltage VDD may be applied to one end (i.e., the source) of the first P-type transistor MP11, and the other end (i.e., the drain) of the first P-type transistor MP11 may be connected to an output node OPN that outputs the second output signal OSIN. A power supply voltage VDD may be applied to one end (i.e., the source) of the second P-type transistor MP12, and the other end (i.e., the drain) of the second P-type transistor MP12 may be connected to the output node OP that outputs the first output signal OSIP. The first P-type transistor MP11 and the second P-type transistor MP12 may be referred to as load transistors.

The first output signal OSIP and the second output signal OSIN may be determined according to current mirroring of the first P-type transistor MP11 and the second P-type transistor MP12. The first output signal OSIP and the second output signal OSIN may be determined based on the amount of current flowing through the first N-type transistor MN11 and the second N-type transistor MN12. When the level of the first input signal INP is higher than the level of the second input signal INN, a relatively large amount of current flows in the first N-type transistor MN11 than in the second N-type transistor MN12, such that the level of the first output signal OSIP may increase and the level of the second output signal OSIN may decrease.

The second comparator 232 may amplify or invert the first output signal OSIP output from the first comparator 231. For example, the second comparator 232 may be implemented as an amplifier. For example, the second comparator 232 may include a differential amplifier or an inverter. The output signal OS2 output from the second comparator 232 may be provided to the counter 151 as a comparison result signal.

The second comparator 220 may include a plurality of transistors MP2 and MN2 and a capacitor CA2. The first output node OP of the first comparator 210 may be connected to the gate of the P-type transistor MP2 of the second comparator 220, and the first output signal OSIP of the first comparator 210 may be input as an input signal of the second comparator 220. A power supply voltage VDD may be applied to the source of the P-type transistor MP2, and a drain of the P-type transistor MP2 may be connected to an output node where the output signal OS2 of the second comparator 220 is output.

A drain of the N-type transistor MN2 may be connected to the output node of the second comparator 220, and a ground voltage may be applied to a source of the N-type transistor MN2. That is, the P-type transistor MP2 and the N-type transistor MN2 may be serially connected to each other. The N-type transistor MN2 may operate as a current source and generate a bias current based on the voltage of one node of the capacitor CA2.

Figure 10:
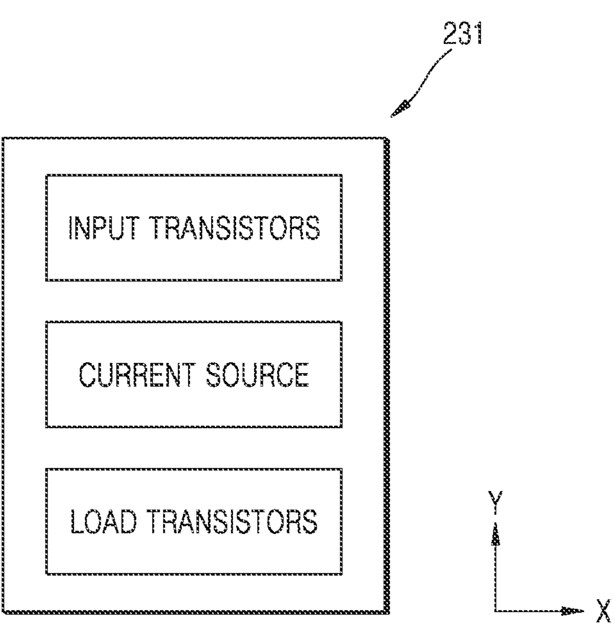
FIG. 10 is a layout diagram illustrating a disposition order of transistors constituting a first comparator of a column parallel ADC according to an embodiment.

FIG. 10 is a layout diagram illustrating a disposition order of transistors constituting the first comparator 231 of the column parallel ADC CADC of FIG. 9, according to an embodiment. Referring to FIGS. 9 and 10, transistors constituting the first comparator 210 may be composed of FinFETs, and all fins of the FinFETs of the first comparator 210 may have the same fin direction.

In an embodiment, in relation to the first comparator 210, input transistors (e.g., a first N-type transistor MN11 and a second N-type transistor MN12), a current source CS (e.g., an N-type transistor constituting the current source CS), and load transistors (e.g., the first P-type transistor MP11 and the second P-type transistor MP12) may be sequentially arranged in a direction opposite to the Y-axis direction (e.g., −Y direction). Also, in an embodiment, the arrangement order in FIG. 10 may be flipped to arrange transistors (e.g., a first N-type transistor MN11 and a second N-type transistor MN12), a current source (e.g., an N-type transistor constituting a current source), and load transistors (e.g., a first P-type transistor MP11 and a second P-type transistor MP12) may be sequentially arranged in the Y-axis direction (e.g., +Y direction). However, unlike shown in FIG. 10, the arrangement order of the input transistors, the current source CS, and the load transistors may be variously changed.

Figure 11:
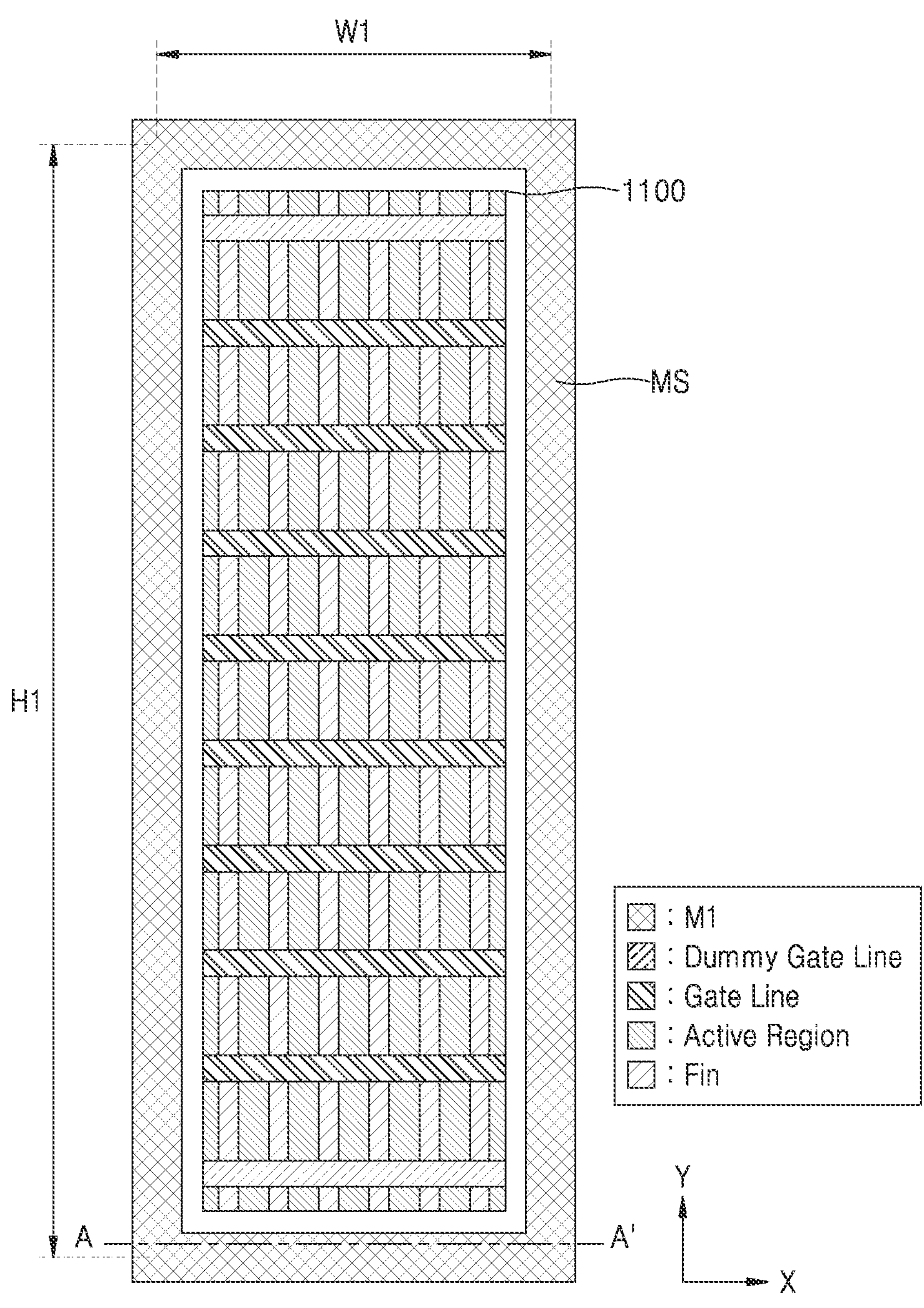
FIG. 11 is a layout diagram of FinFETs included in a peripheral circuit chip according to an embodiment.
Figure 12:
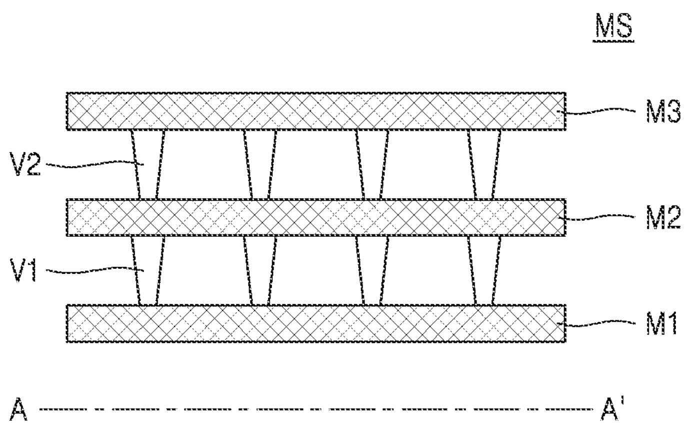
FIG. 12 is a cross-sectional view taken along line A-A' of FIG. 11 according to an embodiment.

FIG. 11 is a layout diagram of FinFETs included in a peripheral circuit chip according to an embodiment. That is, FIG. 11 is a layout diagram of FinFETs included in the peripheral circuit chip of FIG. 8. FIG. 12 is a cross-sectional view taken along line A-A' of FIG. 11. For example, FIG. 11 may be a layout diagram of FinFETs constituting the column parallel ADC CADC of FIG. 8, but is not limited thereto.

Referring to FIGS. 11 and 12, a plurality of gate lines and a plurality of dummy gate lines constituting the FinFETs may be formed to extend in an X-axis direction and be spaced apart from each other in a Y-axis direction. Dummy gate lines may be placed closest to the boundary region 1100 of the FinFETs. For example, dummy gate lines may be placed between the gate lines and the boundary region 1100 of the FinFETs. In an embodiment, the width of the dummy gate line may be less than that of the gate line.

A plurality of fins may be formed to extend in the Y-axis direction and be spaced apart from each other in the X-axis direction on the active region of the FinFETs. For example, the active region may be an active region for forming a P-type FinFET or an active region for forming an N-type FinFET.

The FinFETs may include a metal shielding structure MS to prevent mutual interference with other adjacent FinFETs. The metal shielding structure MS may be formed to surround the active region, gate lines, and dummy gate lines of the FinFETs. A portion of the metal shielding structure MS may be shared between adjacent FinFETs.

The metal shielding structure MS may include a plurality of metal layers, and vias vertically connecting different metal layers each other. Patterns may be formed on the plurality of metal layers. For example, the metal shielding structure MS may include the first metal layer M1, the second metal layer M2, and the third metal layer M3, that are sequentially stacked on the substrate and all of which may include patterns formed thereon. The metal shielding structure MS may include a first via V1 connecting the first metal layer M1 to the second metal layer M2, and a second via V2 connecting the second metal layer M2 to the third metal layer M3.

To form an input signal line for providing an input signal provided to the FinFETs and an output line for outputting an output signal output from the FinFETs, the metal shielding structure MS may not be formed in some regions of some of the plurality of metal layers. For example, although FIG. 11 shows a metal shielding structure MS formed on the first metal layer M1 to surround the FinFETs in a plan view, this disclosure is not limited thereto, and some patterns of the first metal layer M1 may form input/output lines of the FinFETs and the metal shielding structure MS may be formed to partially expose a portion surrounding the FinFETs to form input/output lines of the FinFETs.

In an embodiment, a metal shielding structure MS may not be formed to separate adjacent FinFETs from each other. Also in an embodiment, the metal shielding structure MS may not be formed to surround one FinFET, and the metal shielding structure MS may be formed to surround the plurality of FinFETs (e.g., the five transistors MP11, MP12, MN11, and MN12 constituting the first comparator 231 of FIGS. 9 and 10) to isolate the plurality of FinFETs from other plurality of FinFETs.

Figure 13:
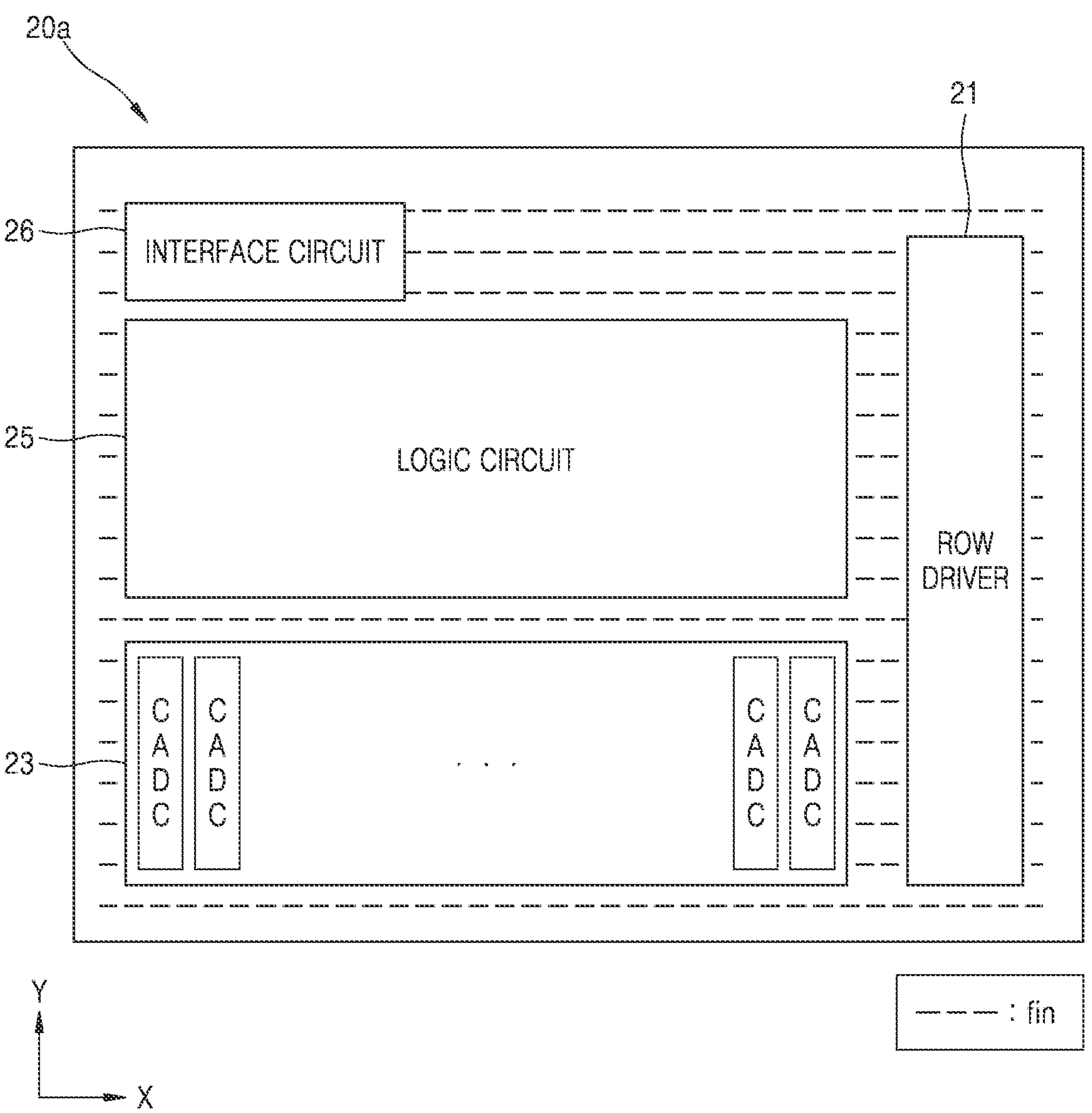
FIG. 13 is a layout diagram illustrating a layout of transistors of a peripheral circuit chip of an image sensor according to an embodiment.

FIG. 13 is a layout diagram illustrating a layout of transistors of a peripheral circuit chip 20*a* on which a peripheral circuit of an image sensor is disposed according to an embodiment. The peripheral circuit chip 20*a* of FIG. 13 may be the second chip CP2 of FIGS. 2 and 3 or the third chip CP3 of FIG. 3. Referring to FIG. 13, the peripheral circuit chip 20*a* may include a row driver 21, an ADC 23, a logic circuit 25, and an interface circuit 26. The row driver 21 may be the row driver 120 of FIG. 1, the ADC 23 may be the ADC 130 of FIG. 1, and the logic circuit 25 may include the timing generator 170 of FIG. 1 and a signal processing unit. The peripheral circuit chip 20*a* may include a plurality of FinFETs, and a fin extending direction of each of the FinFETs of the peripheral circuit chip 20*a* may be the same as the X-axis direction.

The ADC 23 may include a plurality of column parallel ADC CADC, and each of the plurality of column parallel ADC CADC may include the comparison circuit 141 and the counter 151 of FIG. 1. Each of the plurality of column parallel ADCs CADCs may be arranged side by side in the X-axis direction. At least one of the circuits constituting the plurality of column parallel ADCs CADCs, for example, the comparison circuit 141 and the counter 151, may be implemented as a FinFET. When at least one of the comparison circuit 141 and the counter 151 is implemented as a FinFET, the logic circuit 25, such as a timing controller or the signal processing unit, may be implemented with FinFETs, and fin directions may all match each other.

Figure 14:
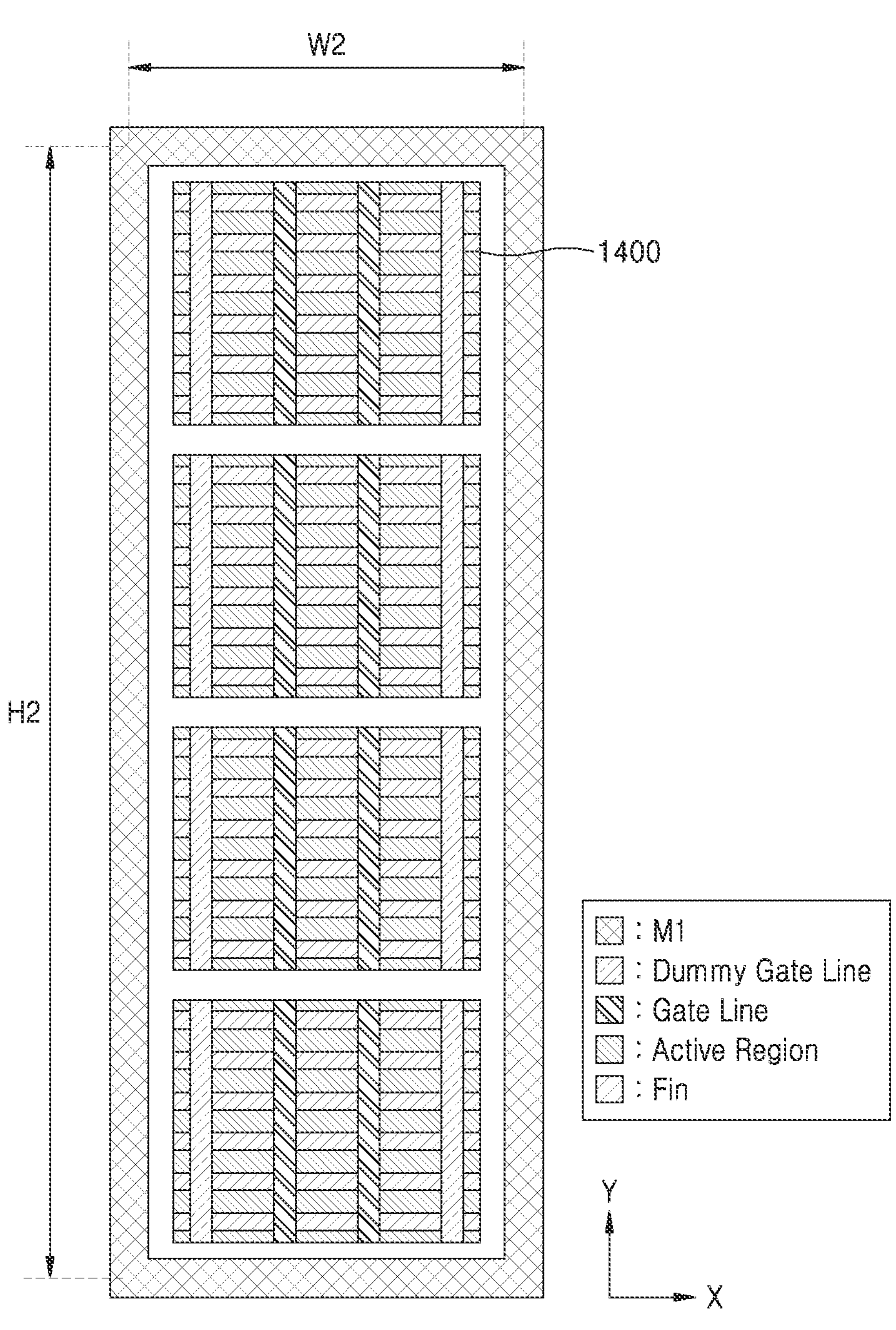
FIG. 14 is a layout diagram of FinFETs included in a peripheral circuit chip according to an embodiment.

FIG. 14 is a layout diagram of a FinFET included in the peripheral circuit chip 20*a* of FIG. 13. For example, FIG. 14 may be a layout diagram of FinFETs constituting the column parallel ADC CADC of FIG. 13, but is not limited thereto.

Referring to FIG. 14, a plurality of gate lines and a plurality of dummy gate lines constituting a FinFET may be formed to extend in the Y-axis direction and be spaced apart from each other in the X-axis direction. The dummy gate line may be disposed closest to the boundary region 1400 of the FinFET, and in an embodiment, the dummy gate line may have a narrower width than the gate line.

The FinFET may include a plurality of active regions, and on each of the active regions, a plurality of fins may be formed to extend in an X-axis direction and to be spaced apart from each other in a Y-axis direction. For example, the plurality of active regions may be active regions for forming a P-type FinFET or active regions for forming an N-type FinFET.

A FinFET may include a metal shielding structure MS to prevent mutual interference with other adjacent FinFETs. The metal shielding structure MS may be shared between adjacent FinFETs. The same description as the metal shielding structure MS described in FIGS. 11 and 12 may be applied to the metal shielding structure MS shown in FIG. 14.

The first width W1 and the first height H1 of the FinFET illustrated in FIG. 11 may be different from the second width W2 and the second height H2 of the FinFET illustrated in FIG. 14. The area (W1×H1) of the FinFET shown in FIG. 11 may be smaller than the area (W2×H2) of the FinFET shown in FIG. For example, the area (W1×H1) of the FinFET of FIG. 11 may be about ⅓ times the area (W2×H2) of the FinFET of FIG. 11.

Figure 15:
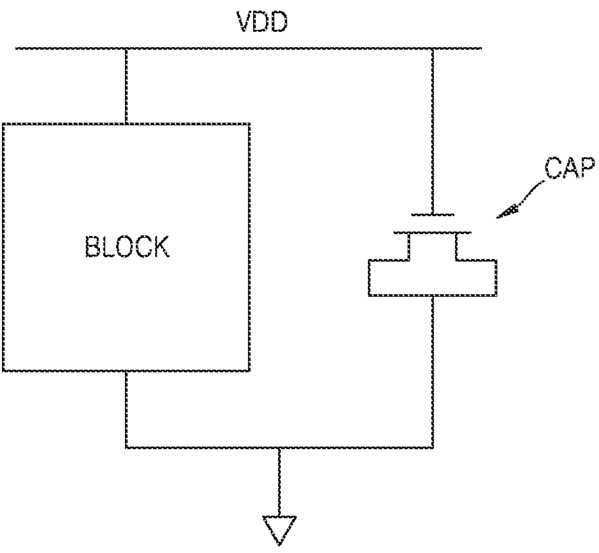
FIG. 15 is a diagram illustrating a decoupling capacitor included in an image sensor according to the disclosure.

FIG. 15 is a diagram illustrating a decoupling capacitor CAP included in an image sensor according to the disclosure.

Referring to FIG. 15, the image sensor may include a decoupling capacitor CAP connected between a first power supply voltage (e.g., VDD) and a second power supply voltage (e.g., VSS or ground voltage). The decoupling capacitor CAP may include a FinFET and may include a source region and a drain region on both sides of the channel region under the gate region. The decoupling capacitor CAP may include a first terminal coupled to the substrate and the gate region and connected to a first power supply voltage, and a second terminal coupled to the source region and the drain region and connected to a second power supply voltage.

The decoupling capacitor CAP may perform a function of removing frequency (high frequency) noise and maintaining a constant voltage applied to a block connected between the first power supply voltage and the second power supply voltage. The block may correspond to each circuit of the peripheral circuit except for the pixel array in the image sensor. The block may be a circuit implemented with a planar FET or a circuit implemented with a FinFET.

Since the decoupling capacitor CAP is implemented as a FinFET, a relatively high capacitance may be secured, and in particular, a ratio of capacitance to leakage current may be improved. Alternatively, the decoupling capacitor CAP may be implemented as an MBCFET or a GAAFET.

In the above-described embodiment, the FinFETs are described as implementing the digital circuit region 11 of the peripheral circuit chip. However, the disclosure is not limited thereto, and a plurality of field-effect transistors of a different type such as nanosheet transistors and/or vertical FETs (VFETs) may be formed instead of the FinFETs or may be combined with the FinFETs to constitute the digital circuit region 11, according to embodiments. The nanosheet transistor also referred to as a multi-bridge-channel FET (MBCFET) or gate-all-around (GAA) FET is characterized by one or more nanosheet channel layers vertically stacked on a substrate as a channel structure and a gate structure surrounding all four surfaces of each of the nanosheet channel layers. The VFET may include at least one vertical fin structure as a channel structure which is laterally surrounded by a gate structure.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An image sensor comprising:

a first chip comprising a pixel array comprising a plurality of pixels; and a second chip comprising a peripheral circuit configured to drive the pixel array and process a pixel signal output from the pixel array, wherein the first chip and the second chip are stacked, wherein the peripheral circuit is implemented with a plurality of field effect transistors (FETs), wherein at least one channel structure of each of the plurality of FETs all extend in a same direction, wherein the peripheral circuit comprises a plurality of column parallel analog-to-digital converters (ADCs) configured to convert the pixel signal output from the pixel array into digital signal, wherein the plurality of column parallel ADCs are disposed parallel to each other in a first horizontal direction, wherein the plurality of FETs comprises at least one fin field-effect transistor (FinFET), the at least one FinFET comprising at least one fin as a channel structure, and wherein the at least one fin extends in a second horizontal direction substantially perpendicular to the first horizontal direction.

2. The image sensor of claim 1, wherein the peripheral circuit comprises:

a row driver configured to drive the pixel array per row; and a timing generator configured to control the row driver and the ADC.

3. The image sensor of claim 2, wherein each of the plurality of column parallel ADCs comprises a comparison circuit and a counter.

4. The image sensor of claim 1, wherein the at least one fin of the at least one FinFET extends in the first horizontal direction.

5. The image sensor of claim 3, wherein the comparison circuit comprises:

a first comparator configured to generate an output signal by comparing the pixel signal to a ramp signal; and a second comparator configured to amplify the output signal, wherein the first comparator comprises:

a plurality of load transistors comprising a first P-type transistor and a second P-type transistor;

a plurality of input transistors comprising a first N-type transistor and a second N-type transistor; and a current source implemented as an N-type transistor, and wherein the plurality of input transistors, the current source, and the plurality of load transistors are sequentially arranged.

6. The image sensor of claim 1, wherein the at least one fin of the at least one FinFET extends in the first horizontal direction on an active region, and wherein the at least one FinFET comprises:

a plurality of gate lines extending in the second horizontal direction; and a plurality of dummy gate lines between the plurality of gate lines and a boundary region of the at least one FinFET, the plurality of dummy gate lines extending in the second horizontal direction.

7. The image sensor of claim 6, wherein the peripheral circuit further comprises a metal shielding structure at least partially surrounding a plurality of fins, the plurality of gate lines and the plurality of dummy gate lines of the at least one FinFET.

8. The image sensor of claim 7, wherein the metal shielding structure comprises:
a plurality of metal layers stacked on a substrate; and
a plurality of vias connecting different metal layers of the plurality of metal layers.

9. The image sensor of claim 1, further comprising a decoupling capacitor configured to:
remove frequency noise generated in the peripheral circuit; and
maintain a voltage applied to at least one circuit connected between a first power supply voltage and a second power supply voltage.

10. An image sensor comprising:
a first chip comprising a pixel array comprising a plurality of pixels; and
a second chip comprising a peripheral circuit configured to drive the pixel array and process a pixel signal output from the pixel array,
wherein the first chip and the second chip are stacked,
wherein the peripheral circuit comprises an analog circuit region in which an analog circuit is provided and a digital circuit region in which a digital circuit is provided,
wherein the digital circuit region comprises a plurality of field-effect transistors (FETs),
wherein the analog circuit region comprises a row controller, a ramp generator, and a source-follower, and
wherein at least one of the row controller, the ramp generator, and the source-follower are implemented as a fin FET (FinFET).

11. The image sensor of claim 10, wherein the analog circuit comprises:
a row driver configured to drive the pixel array per row; and
an analog-to-digital converter (ADC) configured to convert the pixel signal output from the pixel array into a digital signal.

12. The image sensor of claim 11, wherein the digital circuit comprises a timing generator configured to control the row driver and the ADC.

13. The image sensor of claim 10, wherein the plurality of FETs comprises at least one FinFET,
wherein each of the at least one FinFET comprises at least one channel structure, and
wherein the at least one channel structure of each of the at least one FinFET in the digital circuit region extend in a same direction.

14. The image sensor of claim 10, wherein the analog circuit region comprises a FinFET.

15. The image sensor of claim 10, wherein the plurality of FETs comprises a plurality of FinFETs, and
wherein the plurality of FinFETs comprises:
a plurality of fins extending in a first horizontal direction on an active region;
a plurality of gate lines extending in a second horizontal direction; and
a plurality of dummy gate lines between the plurality of gate lines and a boundary region of the plurality of FETs, the plurality of dummy gate lines extending in the second horizontal direction.

16. The image sensor of claim 10, further comprising a decoupling capacitor configured to:
remove frequency noise generated in the peripheral circuit; and
maintain a voltage applied to at least one circuit connected between a first power supply voltage and a second power supply voltage.

17. An image sensor comprising:
a first chip comprising a pixel array comprising a plurality of pixels; and
a second chip under the first chip and comprising a first peripheral circuit,
wherein the first peripheral circuit is implemented using a plurality of fin field-effect transistors (FinFETs) that comprise a plurality of gate lines extending in a first horizontal direction,
wherein a plurality of fins of the FinFETs that are on the second chip all extend in the same direction that is a second horizontal direction perpendicular to the first horizontal direction,
wherein the first peripheral circuit comprises a plurality of column parallel analog-to-digital converters (ADCs) configured to convert the pixel signal output from the pixel array into digital signal, and
wherein the plurality of column parallel ADCs are disposed parallel to each other in the first horizontal direction.

* * * * *